United States Patent
Amirabadi

(10) Patent No.: US 8,565,037 B2
(45) Date of Patent: Oct. 22, 2013

(54) SYMMETRICALLY OPERATING SINGLE-ENDED INPUT BUFFER DEVICES AND METHODS

(71) Applicant: Micron Technology, Inc., Boise, ID (US)

(72) Inventor: Yadollah Eslami Amirabadi, Charleston, WV (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/796,998

(22) Filed: Mar. 12, 2013

(65) Prior Publication Data

US 2013/0187703 A1    Jul. 25, 2013

Related U.S. Application Data

(60) Continuation of application No. 13/270,092, filed on Oct. 10, 2011, now Pat. No. 8,395,956, which is a continuation of application No. 12/960,301, filed on Dec. 3, 2010, now Pat. No. 8,036,058, which is a division of application No. 12/002,829, filed on Dec. 18, 2007, now Pat. No. 7,859,916.

(51) Int. Cl.
*G11C 7/02* (2006.01)

(52) U.S. Cl.
USPC ..................... 365/207; 365/189.05

(58) Field of Classification Search
USPC ........................... 365/207, 189.05
See application file for complete search history.

(56) References Cited

U.S. PATENT DOCUMENTS

| | | | |
|---|---|---|---|
| 5,432,746 A | 7/1995 | Guedj | |
| 5,850,365 A | 12/1998 | Reese et al. | |
| 5,978,251 A | 11/1999 | Kraus | |
| 6,044,013 A | 3/2000 | Tanaka et al. | |
| 6,363,010 B2 | 3/2002 | Tanaka et al. | |
| 6,373,753 B1 | 4/2002 | Proebsting | |
| 6,437,600 B1 * | 8/2002 | Keeth | 326/86 |
| 6,462,584 B1 | 10/2002 | Proebsting | |
| 6,545,909 B2 | 4/2003 | Tanaka et al. | |
| 6,847,582 B2 | 1/2005 | Pan | |
| 7,206,234 B2 | 4/2007 | Pan et al. | |
| RE40,132 E | 3/2008 | Etoh et al. | |
| 7,477,556 B2 | 1/2009 | Keeth et al. | |
| 7,855,910 B2 * | 12/2010 | Mitani et al. | 365/148 |
| 7,859,916 B2 | 12/2010 | Amirabadi | |
| 8,036,058 B2 | 10/2011 | Eslami | |
| 8,223,530 B2 * | 7/2012 | Kitagawa | 365/189.09 |
| 2003/0095456 A1 | 5/2003 | Rickes et al. | |
| 2003/0133351 A1 | 7/2003 | Hidaka | |
| 2007/0046373 A1 | 3/2007 | Staples et al. | |
| 2008/0002481 A1 | 1/2008 | Gogl et al. | |
| 2012/0038422 A1 | 2/2012 | Amirabadi | |

\* cited by examiner

*Primary Examiner* — Tuan T. Nguyen
(74) *Attorney, Agent, or Firm* — Dorsey & Whitney LLP

(57) ABSTRACT

Embodiments are described including those pertaining to an input buffer having first and second complementary input terminals. One example buffer has a symmetrical response to a single input signal applied to the first input terminal by mimicking the transition of a signal applied to the second input terminal in the opposite direction. The buffer includes two amplifier circuits structured to be complementary with respect to each other. Each of the amplifier circuits includes a first transistor having a first input node that receives an input signal transitioning across a range of high and low voltage levels, and a second transistor having a second input node that receives a reference signal. The first input node is coupled to the second transistor through a capacitor to mimic the second input node transitioning in the direction opposite to the transition of the input signal.

20 Claims, 4 Drawing Sheets

SYMMETRICALLY OPERATING SINGLE-ENDED INPUT BUFFER DEVICES AND METHODS

CROSS-REFERENCE TO RELATED APPLICATIONS

This application is a continuation of pending U.S. patent application Ser. No. 13/270,092, filed Oct. 10, 2011, which is a continuation of U.S. patent application Ser. No. 12/960,301, filed Dec. 3, 2010, issued as U.S. Pat. No. 8,036,058 on Oct. 11, 2011, which is a divisional of U.S. patent application Ser. No. 12/002,829, filed Dec. 18, 2007, issued as U.S. Pat. No. 7,859,916 on Dec. 28, 2010. These applications and patents are incorporated herein by reference in their entirety and for any purpose.

TECHNICAL FIELD

Embodiments of the present invention relate generally to integrated memory devices, and more specifically, in one or more embodiments, to an input buffer that can operate in a symmetrical manner despite receiving a single-ended input signal rather than complementary input signals.

BACKGROUND

Input buffers are used for a wide variety of functions in integrated circuits. Buffers generally have a high input impedance to avoid excessively loading circuits to which they are connected, and, conversely, have a low output impedance to drive electrical circuits without excessive loading. Buffers are typically used in digital circuits to condition electrical signals applied to internal circuitry so that internal signals are generated with well-defined logic levels and transition characteristics. For example, buffers may be utilized for coupling command, address and write data signals from respective buses in a memory device, such as a dynamic random access memory ("DRAM") and a synchronous dynamic random access memory ("SDRAM"), so that clean, unambiguous signals are properly received by various components of the memory device.

Input buffer circuits may be used to convert high speed, small swing input signals to digital signals, such as signals required by internal circuitry in memory devices. Differential input buffers conventionally include differential amplifiers, which are symmetrically structured and typically have a differential pair of input terminals and/or output terminals. The symmetrical topography of these differential amplifiers causes them to operate in a symmetrical manner when they receive complementary signals. Differential input buffers are particularly useful in digital circuits for determining whether a single input signal is above a fixed reference voltage, signifying a logic "1" or below the fixed reference voltage, signifying a logic "0". However, in such cases, the input buffers receive a single input signal rather than two complementary input signals. This lack of symmetry in applying signals to the input buffers can cause them to operate in a non-symmetrical manner. As a result, they may not respond to an input signal transitioning from a first level to a second level in the same manner that they respond to an input signal transitioning from the second level to the first level. Moreover, input buffers respond faster to a differential input and hence, can be used at higher frequencies for differential inputs.

There is, therefore, a need for an input buffer that operates more symmetrically when receiving a single-ended input signal so that it responds to transitions of the input signal in one direction in the same manner that it responds to transitions of the input signal in the opposite direction.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
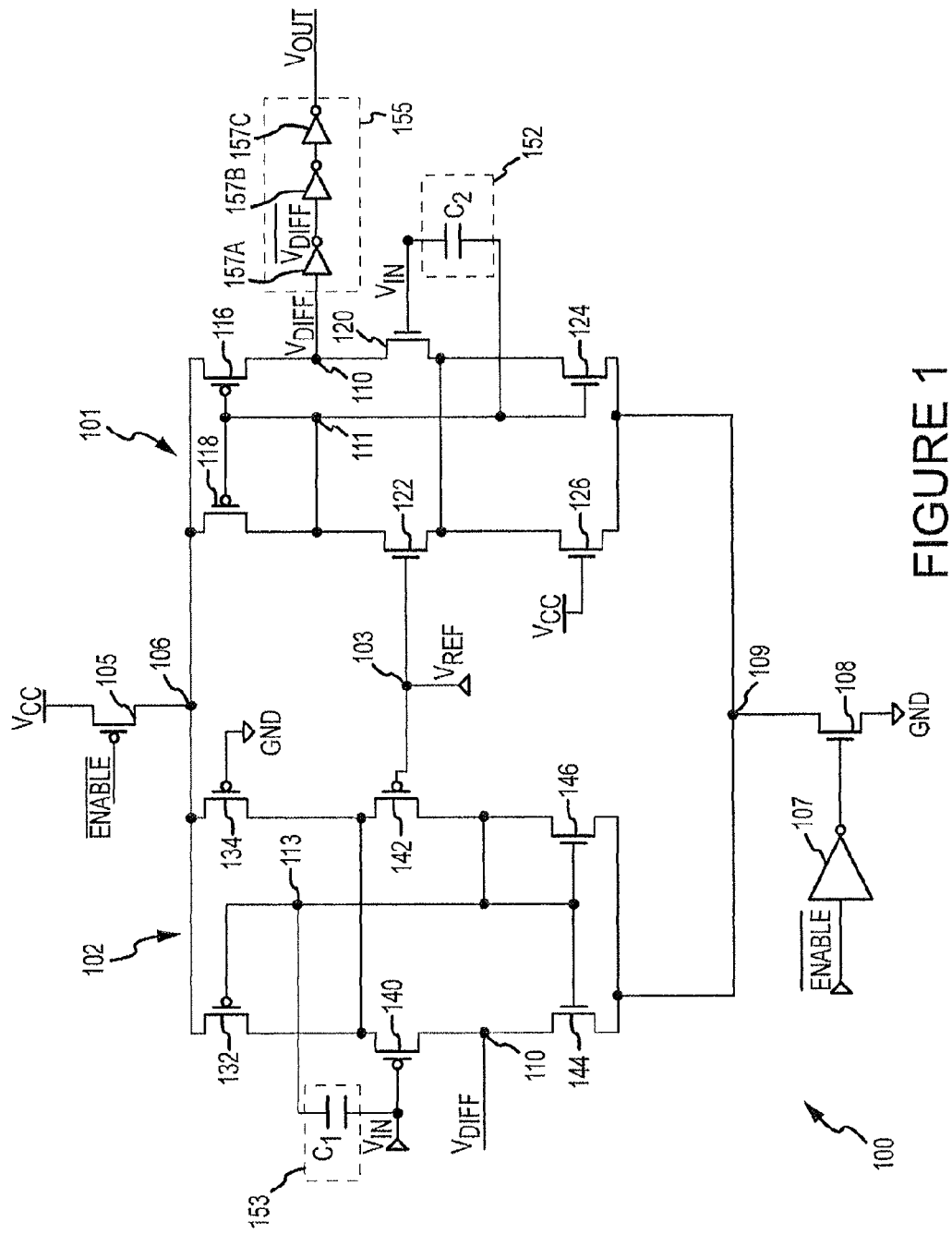
FIG. 1 is a schematic of a differential input buffer circuit according to an embodiment of the invention.

One embodiment of a differential input buffer 100 is shown in FIG. 1 that includes a pair of differential amplifiers 101, 102. The amplifiers 101, 102 are connected in parallel between a PMOS transistor 105 coupled to a supply voltage $V_{CC}$ and an NMOS transistor 108 coupled to ground GND. The PMOS transistor 105 is turned ON by an active low ENABLE control signal that also turns ON the NMOS transistor 108 by coupling the ENABLE signal to the gate of the NMOS transistor 108 through an inverter 107. When turned ON, the transistor 105 functions as a current source providing a constant current to the amplifiers 101, 102 at a node 106, and the transistor 108 functions as a current sink to discharge a constant current from the amplifiers 101, 102 at a node 109.

The amplifiers 101, 102 have essentially the same components, but are configured complementary with respect to each other. The amplifier 101 includes a pair of PMOS transistors 116, 118 whose gates are coupled to each other in a manner such that their gate-to-source voltages are the same. Therefore, the transistors 116, 118 have the same ON-resistance (source-to-drain/drain-to-source resistance). The drains of the transistors 116, 118 are respectively coupled to the drains of NMOS transistors 120, 122, whose gates are configured to receive input terminals to the buffer 100. The gate of the transistor 120 receives an input signal $V_{IN}$, and the gate of the transistor 122 receives a reference signal $V_{REF}$ that is applied to a node 103. The drain of the transistor 116 is additionally coupled to an output node 110. The sources of the transistors 120, 122 are coupled to each other and to the drains of NMOS transistors 124, 126 such that when the ON-resistance of the transistors 124, 126 change, subsequently changing the voltage at the sources of the transistors 120, 122. Since the amplifier 102 has a topology that is complementary to the topology of the amplifier 101, the amplifier 102 includes a pair of NMOS transistors 144, 146 whose gates are coupled to each other and to the drain of the transistor 146. The sources of the transistors 144, 146 are coupled to the node 109 to be coupled to GND when the transistor 108 is turned ON. The drains of the transistors 144, 146 are respectively coupled to the drains of PMOS transistors 140, 142. The output node 110 is similarly coupled between the drain of the transistor 144 and the drain of the transistor 140. Like the transistors 120, 122, the input signals to the buffer 100 are received by the gates of the PMOS transistors 140, 142. The sources of the transistors 140, 142 are coupled to the drains of PMOS transistors 132, 134. Similarly, the gate of the transistor 132 is coupled to the gates of the transistors 144, 146.

The amplifiers 101, 102 as explained so far are conventional, and they are coupled to each other in a conventional manner. However, in contrast to the prior art, the amplifier 101 includes capacitively coupling the gate of the transistor 120 to the gates of the transistors 116, 118, 124 at node 111, such as by a coupling capacitor 152. Similarly, the gate of the transistor 140 may be capacitively coupled to the gates of the transistors 132, 144, 146 at node 113. In a similar manner, a coupling capacitor 153 may be used to represent capacitively coupling the node 113 to the gate of the transistor 140. These capacitors 152, 153 couple transitions of the input signal $V_{IN}$ to the nodes 111 and 113, respectively. As explained in greater detail below, this capacitive coupling makes the amplifiers 101, 102 operate in a substantially symmetrical manner because they mimic the operation of the amplifiers 101, 102 as if complementary signals were applied to the amplifiers 101, 102.

The $V_{DIFF}$ signal may be further refined by propagating the output signal through an output unit 155 coupled to the output node 110. The output unit 155 may include a series of inverters, 157A-C, that incrementally condition the voltage $V_{DIFF}$ at each stage to generate a desired output signal $V_{OUT}$.

As previously described, the $V_{IN}$ signal swings between high and low voltage levels within a particular range for which the input buffer 100 is designed. In operation, when the magnitude of $Y_{IN}$ transitions to a voltage level that is lower than the voltage level of the reference voltage $V_{REF}$, the transistor 120 is turned OFF, and the transistor 140 is turned ON. Turning ON the transistor 140 decreases its ON-resistance to pull the magnitude of a $V_{DIFF}$ signal at the output node 110 towards $V_{CC}$. Since the source terminals of the transistors 140, 142 are connected, the gate-to-source voltage of the transistor 142 decreases due to voltage at the source terminal decreasing and the $V_{REF}$ remaining constant, thus the ON-resistance of the transistor 142 increases. Consequently, the voltage at the node 113 decreases. However, due to coupling the $Y_{IN}$ signal to the node 113 through the coupling capacitor 153, the voltage at the node 113 is further decreased responsive to the $V_{IN}$ signal transitioning low, thereby decreasing the ON-resistance of the transistor 132 and increasing the ON-resistance of the transistors 144, 146 at a faster rate to further pull the output node 110 towards $V_{CC}$ at the faster rate. By coupling a portion of the $V_{IN}$ signal through the capacitor 153, the voltage node 113, which responds to the gate-to-source voltage change of the transistor 142, changes as if the $V_{REF}$ input is transitioning in the opposite direction relative to the transition of the $V_{IN}$ signal. Therefore, the amplifier 102 operates as if it receives complementary input signals despite the $V_{REF}$ input at node 103 remaining constant.

Due to the high ON-resistance of the transistor 120 in the amplifier 101, the transistor 120 is essentially turned off. Therefore, the source terminal voltages of the transistors 120, 122 are low since the source terminal of the transistor 122 is coupled to GND through the transistor 126. Thus the gate-to-source voltage of the transistor 122 is increased to decrease the ON-resistance of the transistor 122, which is opposite to the increased ON-resistance of the transistor 120 due to $V_{IN}$ transitioning low. Consequently, the magnitude of the voltage at the node 111 decreases and further enables the transistors 116, 118 while disabling the transistor 124. As the $V_{IN}$ signal transitions lower, the feedback from the coupling capacitor 152 further drains the node 111, which decreases the ON-resistance of transistors 116, 118 at a faster rate. Consequently, the magnitude of the $V_{DIFF}$ signal at the output node 110 is further pulled towards $V_{CC}$ by the amplifier 101.

The operation of the amplifiers 101, 102 is opposite to that described operation above when the $V_{IN}$ signal transitions high. As the voltage of $V_{IN}$ increases, the ON-resistance of the transistor 120 in the amplifier 101 decreases and the transistor 140 in the amplifier 102 increases. As the ON-resistance of the transistor 120 decreases, the output node 110 is pulled towards GND, thereby decreasing the magnitude of $V_{DIFF}$. Consequently, the gate-to-source voltages of the transistors 122, 142 adjust such that the ON-resistance of the transistor 122 increases and the ON-resistance of the transistor 142 decreases due to the effects of the magnitude of $V_{IN}$ increasing and the $V_{REF}$ remaining constant. In response, the voltage at node 111 increases due to the higher ON-resistance of the transistor 122. As a result, the node 111 provides a higher gate voltage to the transistors 116, 118, 124. The higher voltage on the gate of transistor 124 decreases its ON-resistance, which further pulls the output node 110 towards GND. However, the higher voltage on the transistors 116, 118 increase their ON-resistances, which gradually turns them off. Additionally, a portion of the input signal $V_{IN}$ is applied to the node 111 through the capacitor 152 in a manner that mimics a transition of the $V_{REF}$ signal in the opposite direction of the $V_{IN}$ signal, as previously described. Therefore, the amplifier 101 behaves in a symmetrical manner like a conventional differential amplifier. As a result, as the $V_{IN}$ signal transitions high, the voltage at node 111 responds as if the $V_{REF}$ transitions low as $V_{IN}$ transitions high. Therefore, the gate voltages are provided to the transistors 116, 118, 124 at a faster rate, which causes the output signal $V_{DIFF}$ to respond faster to the transition of $V_{IN}$.

Similar to the previous operation, the voltage at node 113 increases due to the lower ON-resistance of the transistor 142 coupling the node 113 (at the drain of the transistor 146) to $V_{CC}$ through the transistor 134. The voltage of node 113 is increased at a faster rate due to the $V_{IN}$ signal been partially fed through the coupling capacitor 153. Thus the node 113 is driven to a higher voltage at a faster rate, which is applied to the transistors 144, 146 and 132. Therefore, the ON-resistance of the transistors 144, 146 decrease at a faster rate and the ON-resistance of the transistor 132 increases at a faster rate, thereby further driving the output node 110 towards GND. As the input signal $V_{IN}$ transitions high, the amplifiers 101, 102 operate to drive the $V_{DIFF}$ signal towards GND.

Figure 2:
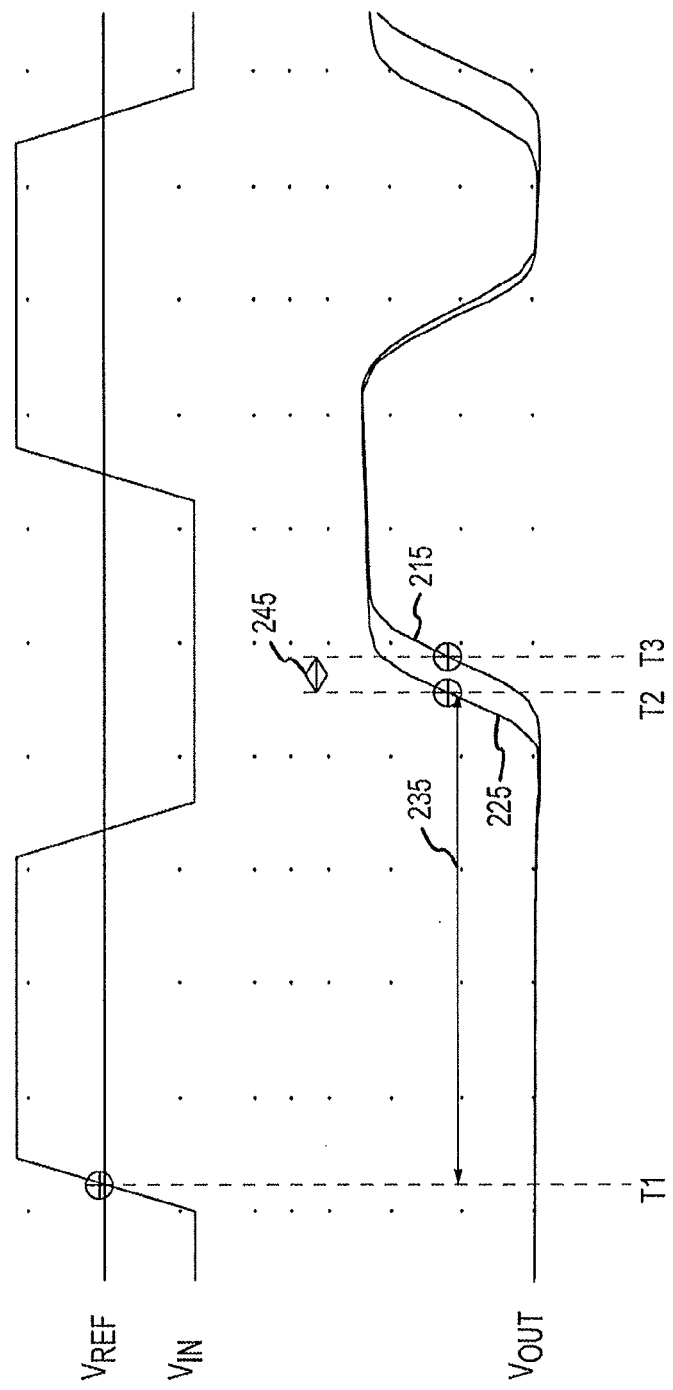
FIG. 2 is signal diagram showing input and output signals of the differential input buffer circuit of FIG. 1.

FIG. 2 is a signal diagram comparing an output signal 215 of the prior art buffer without the capacitors 152, 153 to an output signal 225 of the buffer 100 using the capacitors 152, 153. Also shown in FIG. 2 are the input signal $V_{IN}$ and the reference voltage $V_{REF}$, which are the same for both the prior art buffer and the buffer 100. In response to the input signal $V_{IN}$ transitioning high at time T1, the output signal 225 of the buffer 100 transitions high at a time T2 after a delay. However, the prior art buffer takes longer to generate its output signal 215, which transitions high at a time T3. The buffer 100, therefore, has a faster response time 235 than the prior art buffer by a time difference 245 (T3−T2) due to the buffer 100 coupling a portion of the input signal $V_{IN}$ to the source/drain of the $V_{REF}$ input transistors 122, 142.

The buffer 100 is illustrated in a memory device, such as a synchronous dynamic random access memory ("SDRAM") device 300 according to embodiments of the invention. The SDRAM device 300 includes an address register 312 that receives either a row address or a column address on an address bus 314, preferably by coupling address signals corresponding to the addresses though one embodiment of input buffers 316. The address bus 314 is generally coupled to a memory controller (not shown). Typically, a row address is initially received by the address register 312 and applied to a row address multiplexer 318. The row address multiplexer 318 couples the row address to a number of components associated with either of two memory banks 320, 322 depending upon the state of a bank address bit forming part of the row address. Associated with each of the memory banks 320, 322 is a respective row address latch 326, which stores the row address, and a row decoder 328, which applies various signals to its respective array 320 or 322 as a function of the stored row address. The row address multiplexer 318 also couples row addresses to the row address latches 326 for the purpose of refreshing the memory cells in the arrays 320, 322. The row addresses are generated for refresh purposes by a refresh counter 330, which is controlled by a refresh controller 332.

After the row address has been applied to the address register 312 and stored in one of the row address latches 326, a column address is applied to the address register 312 and coupled through the input buffers 316. The address register 312 couples the column address to a column address latch 340. Depending on the operating mode of the SDRAM 300, the column address is either coupled through a burst counter 342 to a column address buffer 344, or to the burst counter 342 which applies a sequence of column addresses to the column address buffer 344 starting at the column address output by the address register 312. In either case, the column address buffer 344 applies a column address to a column decoder 348 which applies various signals to respective sense amplifiers and associated column circuitry 350, 352 for the respective arrays 320, 322.

Data to be read from one of the arrays 320, 322 is coupled to the column circuitry 350, 352 for one of the arrays 320, 322, respectively. The data is then coupled through a read data path 354 to a data output register 356. Data from the data output register 356 is coupled to a data bus 358 through data output buffers 359. Data to be written to one of the arrays 320, 322 is coupled from the data bus 358 to a data input register 360 through data input buffers 361 according to an embodiment of the invention. The data input register 360 then couples the write data to the column circuitry 350, 352 where they are transferred to one of the arrays 320, 322, respectively. A mask register 364 may be used to selectively alter the flow of data into and out of the column circuitry 350, 352, such as by selectively masking data to be read from the arrays 320, 322.

The above-described operation of the SDRAM 300 is controlled by a command decoder 368 responsive to command signals received on a control bus 370 though command input buffers 372 according to an embodiment of the invention. These high level command signals, which are typically generated by a memory controller (not shown), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 368 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Figure 3:
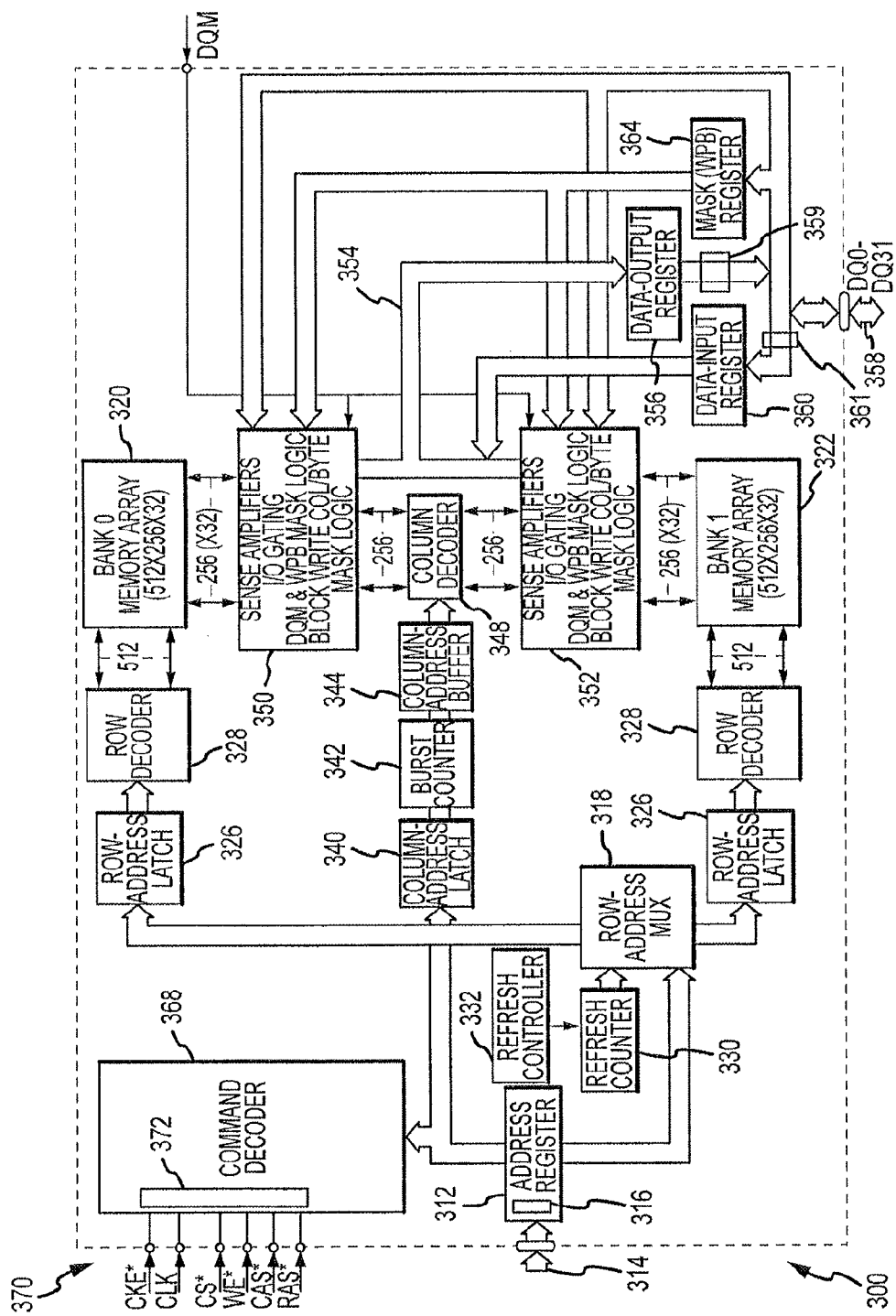
FIG. 3 is a functional block diagram illustrating a memory device that includes at least one differential input buffer circuit according to an embodiment of the invention.

Although, the memory device illustrated in FIG. 3 is a synchronous dynamic random access memory ("SDRAM") 300 that includes the buffer 100 or a buffer according to another embodiment of the invention, the buffer 100 or other embodiments of a buffer can be used in other types of memory devices, as well as other types of digital devices.

Figure 4:
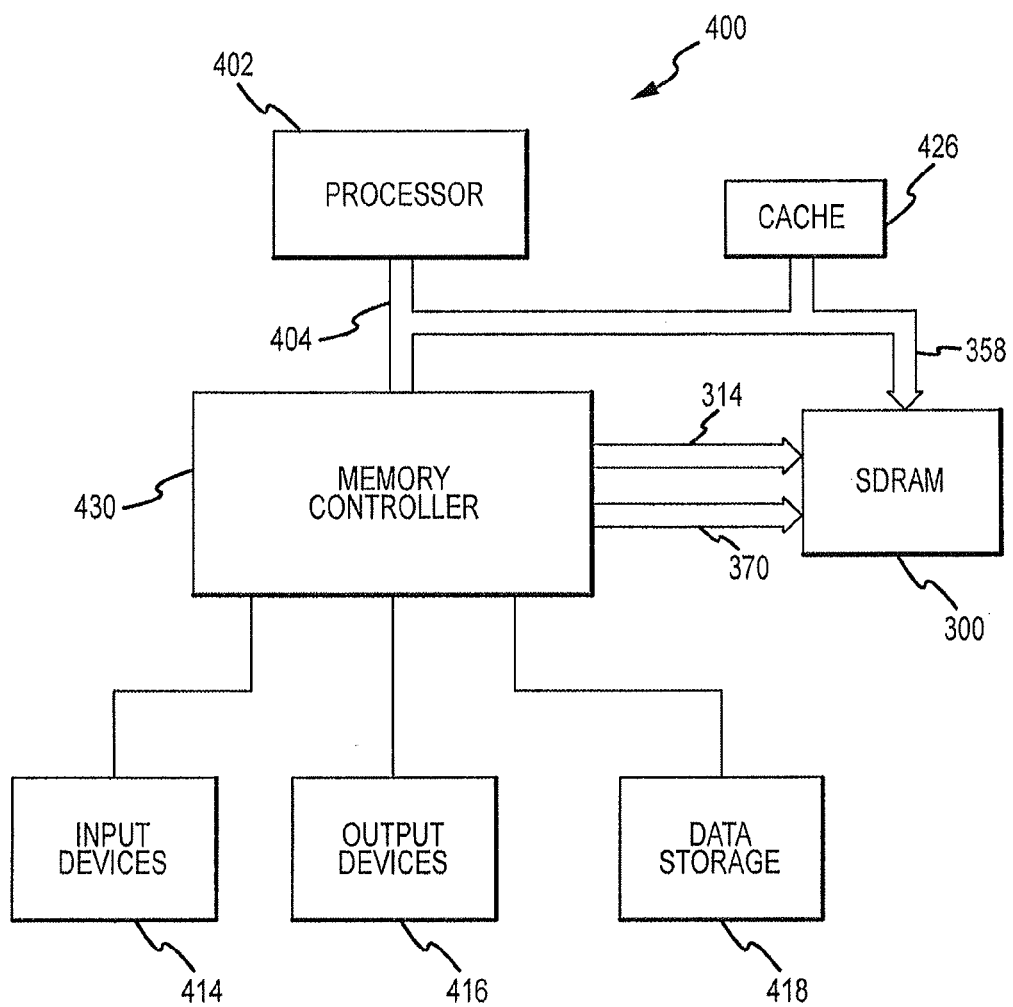
FIG. 4 is a functional block diagram illustrating a computer system including the memory device of FIG. 3.

FIG. 4 shows a computer system 400 containing the SDRAM 400 of FIG. 3. The computer system 400 includes a processor 402 for performing various computing functions, such as executing specific software to perform specific calculations or tasks. The processor 402 includes a processor bus 404 that normally includes an address bus, a control bus, and a data bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to allow the processor 402 to store data in or retrieve data from internal or external storage media (not shown). Examples of typical storage devices 418 include hard and floppy disks, tape cassettes, and compact disk read-only memories (CD-ROMs). The processor 402 is also typically coupled to cache memory 426, which is usually static random access memory ("SRAM"), and to the SDRAM 100 through a memory controller 430. The memory controller 430 is coupled to the SDRAM 300 through the normally control bus 370 and the address bus 314. The data bus 358 is coupled from the SDRAM 300 to the processor bus 404 either directly (as shown), through the memory controller 430, or by some other means.

From the foregoing it will be appreciated that, although specific embodiments of the invention have been described herein for purposes of illustration, various modifications may be made without deviating from the spirit and scope of the invention. Accordingly, embodiments of the invention are not limited except as by the appended claims.

What is claimed is:

1. An apparatus, comprising:
a first transistor configured to receive an input signal and adjust a resistance of a second transistor based, at least in part, on the input signal, the first transistor configured to provide an output signal based, at least in part, on the input signal,
wherein a rate at which the output signal is provided is based, at least in part, on a magnitude of the resistance of the second transistor.

2. The apparatus of claim 1, wherein the resistance is an ON-resistance.

3. The apparatus of claim 1, wherein the input signal comprises an analog signal and the output signal comprises a digital signal.

4. The apparatus of claim 3, wherein the first transistor is configured to provide the output signal having a first state when the input signal has a voltage less than a reference voltage and to provide the output signal having a second state when the input signal has a voltage greater than the reference voltage.

5. The apparatus of claim 1, wherein a terminal of the first transistor and a terminal of the second transistor are capacitively coupled.

6. The apparatus of claim 1, wherein the second transistor and a third transistor comprise a current mirror.

7. The apparatus of claim 1, further comprising:
an output unit coupled to the first transistor and configured to receive the output signal, the output unit further configured to condition the output signal.

8. An apparatus, comprising:
a first transistor configured to receive an input signal and provide an output signal based, at least in part, on the input signal; and
a second transistor having an ON-resistance, the ON-resistance based, at least in part, on a magnitude of a voltage of the input signal and a magnitude of a reference voltage,
wherein the output signal is based, at least in part, on the ON-resistance.

9. The apparatus of claim 8, wherein the reference voltage is maintained at a same voltage.

10. The apparatus of claim 8, wherein respective gates of the first and second transistors are capacitively coupled.

11. The apparatus of claim 8, further comprising:
an inverter configured to receive the output signal and condition the output signal.

12. The apparatus of claim 8, wherein the ON-resistance of the second transistor is configured to increase responsive, at least in part, to the magnitude of the voltage of the input signal being greater than the magnitude of the reference voltage and to decrease responsive, at least in part, to the magnitude of the voltage of the input signal being less than the magnitude of the reference voltage.

13. The apparatus of claim 12, wherein the reference voltage transitions in a direction opposite of transitions of the input signal.

14. The apparatus of claim 8, wherein the ON-resistance is a first ON-resistance, the apparatus further comprising:
a third transistor having a second ON-resistance, wherein the second and third transistors are configured to have their ON-resistances adjusted symmetrically.

15. A method, comprising:
receiving an input signal at a terminal of a first transistor;
adjusting a resistance of a second transistor based, at least in part, on the input signal;
providing, with the first transistor, an output signal at a rate, the rate based, at least in part, on the resistance.

16. The method of claim 15, wherein adjusting a resistance of a second transistor based, at least in part, on the input signal comprises:
providing to the second transistor, with a capacitor, a transition of the input signal.

17. The method of claim 15, further comprising:
incrementally conditioning the output signal with a plurality of series-coupled inverters.

18. The method of claim 15, further comprising:
transitioning a reference voltage responsive, at least in part, to a transition of the input signal.

19. The method of claim 15, wherein adjusting a resistance of a second transistor based, at least in part, on the input signal comprises:
comparing a voltage of the input signal to a reference voltage.

20. The method of claim 15, wherein adjusting a resistance of a second transistor comprises adjusting the resistance of the second transistor in a first manner, the method further comprising adjusting an resistance of a third transistor in a second manner,
wherein the first manner and the second manner are complementary.

\* \* \* \* \*